United States Patent
Barowski et al.

(10) Patent No.: US 9,437,285 B1
(45) Date of Patent: Sep. 6, 2016

(54) WRITE ADDRESS SYNCHRONIZATION IN 2 READ/1WRITE SRAM ARRAYS

(71) Applicant: International Business Machines Corporation, Armonk, NY (US)

(72) Inventors: Harry Barowski, Boeblingen (DE); Silke Penth, Boeblingen (DE); Wolfgang Penth, Boeblingen (DE); Tobias Werner, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/070,210

(22) Filed: Mar. 15, 2016

Related U.S. Application Data

(63) Continuation of application No. 14/958,996, filed on Dec. 4, 2015.

(51) Int. Cl.
| | |
|---|---|
| *G11C 8/10* | (2006.01) |
| *G11C 11/419* | (2006.01) |
| *G11C 11/418* | (2006.01) |
| G11C 8/08 | (2006.01) |
| G11C 8/12 | (2006.01) |

(52) U.S. Cl.
CPC ............ *G11C 11/419* (2013.01); *G11C 11/418* (2013.01); *G11C 8/08* (2013.01); *G11C 8/10* (2013.01); *G11C 8/12* (2013.01)

(58) Field of Classification Search
CPC .............. G11C 8/10; G11C 8/08; G11C 8/12
USPC ............................ 365/230.06, 156, 190, 202
See application file for complete search history.

(56) References Cited

U.S. PATENT DOCUMENTS 5,327,377 A  *  7/1994  Kawashima ............. G11C 7/18
257/E27.1

OTHER PUBLICATIONS

Harry Barowski, et al., Pending U.S. Appl. No. 14/958,996 entitled "Write Address Synchronization in 2 Read/1Write SRAM Arrays," filed Dec. 4, 2015.
List of IBM Patents or Patent Applictions Treated as Related; (Appendix P), Filed Mar. 15, 2016, 2 pages.

* cited by examiner

*Primary Examiner* — Jason Lappas
(74) *Attorney, Agent, or Firm* — Cantor Colburn LLP; Margaret McNamara

(57) ABSTRACT

An aspect relates to a memory array that includes at least a first and a second six transistor static random access memory cell, and first and second address decoders. The first address decoder comprises a first latch, the second address decoder a second latch. First and second address data paths provide first and second address data to the at least two address decoders. The first latch is electrically conductive connected to the first data path and the second latch is electrically conductive connected to the second data path. The first latch is further electrically conductive connectable to the second data path via a first multiplexer. The first multiplexer and the at least two latches are configured to be selectively operated in a first write mode for a write access or in a read mode for a read access to the memory array.

8 Claims, 10 Drawing Sheets

WRITE ADDRESS SYNCHRONIZATION IN 2 READ/1WRITE SRAM ARRAYS

DOMESTIC PRIORITY

This application is a continuation of U.S. patent application Ser. No. 14/958,996, filed Dec. 4, 2015, the content of which is incorporated by reference herein in its entirety

BACKGROUND

The present disclosure relates to the field of memory and more particularly to the field of static random-access memory (SRAM).

SRAM is a type of semiconductor memory that includes a plurality of SRAM cells each using bistable latching circuitry to store a bit. SRAM is referred to as static in order to differentiate it from dynamic random-access memory (DRAM). DRAM has to be periodically refreshed in contrary to SRAM which exhibits data remanence. However, SRAM is still volatile in the sense that data is eventually lost when the SRAM is not powered anymore. A variety of SRAM types are known utilizing cells that include different number of transistors, e.g. 4, 6, 8, 10 (4T, 6T, 8T, 10T SRAM), or more transistors per cell. A 6T SRAM may for example utilize six metal-oxide semiconductor field-effect transistors (MOSFETs) per cell to store each memory bit. More precisely, each bit may be stored on four transistors that form a storage element comprising two cross-coupled inverters each of which is formed by two transistors. Two additional access transistors may serve to control access to the cell during read and/or write operations. The respective 6T memory cell has two stable states that are denoted logical '0' and logical '1'.

Access to a typical 6T SRAM cell is facilitated by one or more wordlines that control the two access transistors which, in turn, control whether the cell is coupled to one or more bitlines. The SRAM cells or simply cells of an SRAM array or simply memory array may be organized into a matrix form comprising m columns and n rows. A row comprising m cells represents an m-bit word. All cells in a row may be electrically conductive connected to a common wordline for selecting the respective row by addressing the wordline. For reading data from and writing data to the cells of an SRAM array, all cells of a column may be electrically conductive connected to a common pair of bitlines, i.e. a bitline true and a bitline complement. During a read operation, the bit value stored in the memory cell is typically read using both bitlines of the respective pair of bitlines in order to improve noise margins: via the bitline true (blt) the bit value is read, while its inverse value is read via the bitline complement. By selecting a wordline, each of the m bits of a word formed by a row connected with the selected wordline may be synchronously read from or written to a cell of the row via the bit lines connected to the respective cell.

An SRAM cell has three different states: standby, reading, and writing. In a standby state, an SRAM is idle. In a reading state, data has been requested from the SRAM. In a writing state, contents of the SRAM are updated. For a read or write access to an SRAM cell the wordline(s) of the respective cell are asserted initiating the access transistor(s) to connect the SRAM cell to bitline(s). If wordlines are not asserted, access transistors disconnect the SRAM cell from bitlines. In this case, the two cross-coupled inverters continue to reinforce each other as long as they are connected to a power supply.

High-speed memory access has become increasingly important to the overall performance of processors and data processing systems. In general, the read access performance may be critical for the timing performance of an SRAM array, i.e. one of the main contributors to memory latency.

SUMMARY

Embodiments include a method, system, and computer program product for write address synchronization in a two read/one write static random-access memory (SRAM). The system includes a memory array that includes at least a first and a second six transistor static random access memory cell, and first and second address decoders. The first address decoder comprises a first latch, the second address decoder a second latch. First and second address data paths provide first and second address data to the at least two address decoders. The first latch is electrically conductive connected to the first data path, the second latch is electrically conductive connected to the second data path. The first latch is further electrically conductive connectable to the second data path via a first multiplexer. The first multiplexer and the at least two latches are configured to be selectively operated in a first write mode for a write access or in a read mode for a read access to the memory array. In the first write mode second address data provided by the second address data path via the first multiplexer is captured by the first latch from a second data input of the first latch and second address data is captured by the second latch from a first data input of the second latch. In the read mode first address data is captured by the first latch from a first data input of the first latch and second address data by the second latch from its first data input.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
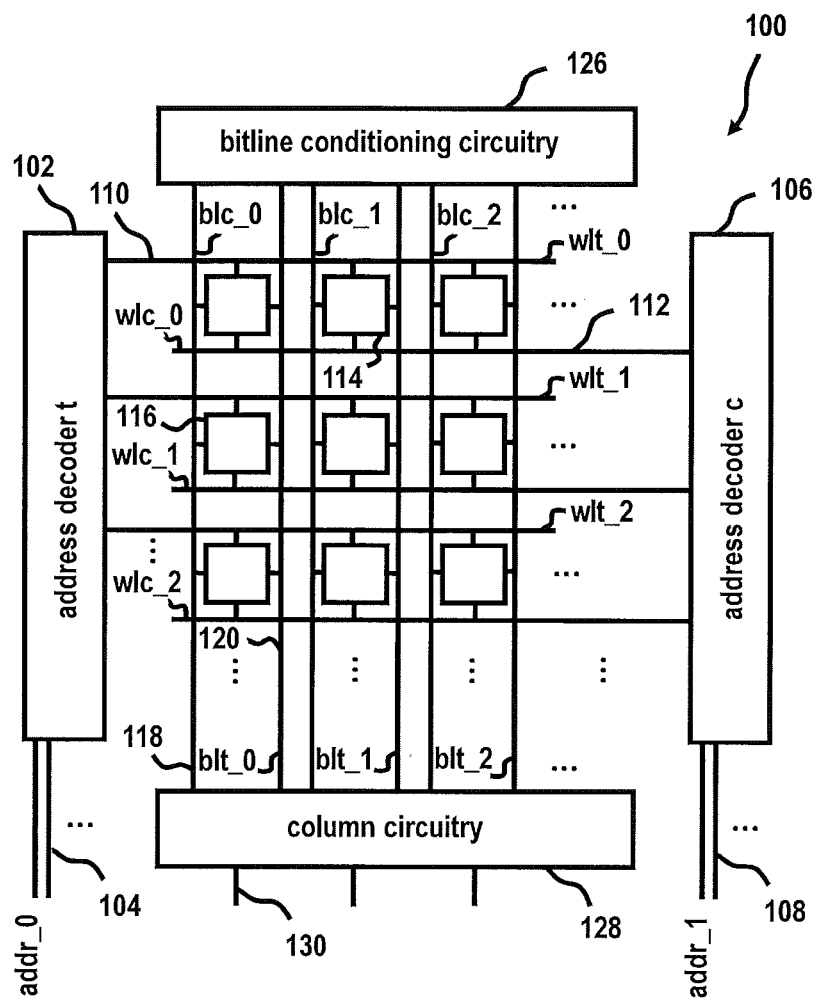
FIG. 1 depicts a schematic diagram illustrating an exemplary SRAM array in accordance with some embodiments of this disclosure.

Embodiments of the present disclosure provide write address synchronization in two read/one write static random-access memory (SRAM) arrays. The memory array can be implemented in the form of a complex digital electronic circuit composed of a plurality of individual electronic components, such as resistors, transistors, capacitors, inductors and diodes, connected by conductive wires or traces, i.e. paths, through which electric current may flow. The circuit may for example be an integrated circuit. The electric signals may be provided and received in the form of discrete values representing information in terms of logical and numeric values, in particular binary values of logical '0' and logical '1', by the components of the circuit via respective paths. An electrically conductive connection between a first and a second component may be established via one or more paths as well as additional components, when an electric signal provided to the respective connection by the first component is receivable by the second component. The two components may be disconnected, i.e. the connection may be interrupted, when the provided electric signal is not receivable anymore. This may be due to a switching element used for the connection, like for example, a multiplexer comprising at least two inputs and an output. The first component may be electrically conductive connected to a first input of the multiplexer, the second component may be electrically conductive connected to the output. In a first mode of operation in which the multiplexer captures electric signals provided to the first input and transfer the same to its output, first and second component are electrically conductive connected. In a second mode of operation in which the multiplexer does not capture electric signals provided to the first input, but e.g. rather signals provided to a second input, first and second component are not electrically conductive connected anymore. Thus, a switching element like for example a multiplexer may be used to connect and disconnect the two components by switching between a first and second mode of operation.

A 'latch' as used herein refers to a circuit also known as a flip-flop that has two stable states and can be used to store state information. A latch may either be simple, i.e. transparent or opaque, or clocked, i.e. synchronous or edge-triggered. Although the term flip-flop may sometimes be used exclusively for discussing clocked circuit elements, while only simple circuit elements are referred to as latches, herein the term latch may comprise both implementations.

A two read/one write (2R/1W) array of 6T SRAM cells may use two separate wordlines, i.e. wordline true wlt and wordline complement wlc, per word or row of the array. This approach may require two address decoders, one for the decoding of the wordline true address and one for the wordline complement address. For a read access, two different word addresses are provided such that a wordline true and a wordline complement of different rows of the SRAM array may be asserted. Thus, two different words, i.e. rows, may be read in parallel using the bitline true for the word selected via the wordline true and the bitline complement for the word selected via the wordline complement. For a write access wordlines true and complement of the same row of the SRAM array may be asserted. Thus, data may be written to one row at a time improving noise margins.

Embodiments may have the beneficial effect of improving the read performance of 2R/1W SRAM arrays by speeding up the read decoding. Further, logic functionality required for write decoding may be removed by using the scan inputs of address decoder latches as data input for an address path during write mode. Multiplexer(s) in general requiring additional time and slowing down the performance may only be involved in write operations. Timing critical read operations may be performed without involving the multiplexer and are thus not slowed down by the implementation of multiplexer for the write operation. Using the second data input as a multiplexer mode depending additional data input may have the beneficial effect that the multiplexer may be arranged on a data path parallel to the first address data path. Thus, it is possible to perform a read operation without involving a multiplexer. By avoiding the multiplexer in the address path for read operations the performance may be speeded up.

During read operation a wordline true and a wordline complement each addressing different cells may be used in order to read out two cells simultaneously. In case the SRAM array comprises a plurality of cells arranged in a matrix pattern with rows and columns, the wordline true and the wordline complement may each address a different row allowing reading out two rows, i.e. words, simultaneously using one bitline per cell. Reading two cells and/or words simultaneously may speed up the reading of a given set of cells or words by a factor of two compared to known approaches according to which both wordlines address the same cell. With both wordlines addressing the same cell and/or word, only one cell or word at a time may be read using a pair of bitlines per cell. During write operation a wordline true and a wordline complement may address the same cell in order to guarantee a successful writing of data to the respective SRAM cell.

The addresses provided to the address decoders may be wordline addresses. When reading or writing data all cells connected to the same wordline addressed may be asserted. In other words whole words, i.e. rows of the memory array, may be read from or written to. All cells arranged in the same row of the memory array may be connected with the same pair of wordlines, i.e. the same first and second wordline. The respective first wordline is connected with the first address decoder, the second wordline with the second address decoder. According to embodiments, at least the first and second cell may be arranged in different row of the memory array, i.e. they may be connected with different pairs of first and second wordlines. In other words, each of the respective cells is connected with a first and a second wordline, wherein the first wordline of the first cell is different from the first wordline of the second cell. This analogously applies to the second wordlines, with the second wordline of the first cell being different from the second wordline of the second cell.

Embodiments of the present invention address the access speed of an SRAM array in order to provide for an SRAM array with high-speed memory access. Embodiments provide a memory array comprising at least a first and a second six transistor static random access memory cell and a method for operating a respective memory array. Embodiments of the invention are given in the dependent claims. Embodiments of the present invention can be freely combined with each other if they are not mutually exclusive.

According to embodiments, the memory array further comprises a first local clock buffer electrically conductive connected to one or more clock signal inputs of the first latch for providing the first latch with a first and a second local clock signal, the first local clock buffer is configured to be selectively operated in a first write mode for the write access or in a read mode for the read access to the memory array, in the read mode the first local clock buffer provides the first latch with the first local clock signal, the first local clock signal triggers the first latch to capture the first address data from its first data input, in the first write mode the first local clock buffer provides the first latch with the second local clock signal triggering the first latch to capture the second address data from its second data input.

This may have the beneficial effect that the first local clock buffer provides an efficient control for selectively switching the mode of operation of the first latch from the read mode to the first write mode and vice versa by switching the mode of operation of the first local clock buffer.

According to embodiments, the second data input of the first latch is electrically conductive connectable by the first multiplexer to a first scan data path for providing first scan data to initialize the first latch for performing a test of the memory array, the second latch further comprises a second data input and is configured to selectively capture data from the first or the second data input, the first multiplexer and the at least two latches are configured to be selectively operated in a scan mode for performing the test of the memory array, in the scan mode the second data input of the first latch is electrically conductive connected to the first scan data path by the first multiplexer, the second data input of the second latch is electrically conductive connected to a second scan data path for providing second scan data to initialize the second latch for performing the test of the memory array, first scan data is captured by the first latch from its second data input and second scan data is captured by the second latch from its second data input.

This may have the beneficial effect that the second data input of the first latch is a scan data input for providing scan data to initialize the first latch for performing tests of the circuitry comprising the respective latch. For example, the scan input of the first latch arranged at the input of the first address decoder may be used to provide a second data input for first address data via the first multiplexer arranged in front of the respective scan input. This may further have the beneficial effect that it is still possible to perform a scan operation and initialize the values stored in the latches for testing purposes of the circuitry comprising the respective latches and/or being functionally coupled to the same. For example a logic built-in self-test (LBIST) may be performed. An LBIST in which hardware and/or software is built into integrated circuits allows the integrated circuits to test their own operation, as opposed to reliance on external automated test equipment. An LBIST may have the beneficial effect that the ability to test internal circuits having no direct connections to external pins is provided, and thus are unreachable for external automated test equipment.

According to embodiments, the first multiplexer is electrically conductive connected to the write enabling path for providing the write enabling signal triggering the first write mode of the first multiplexer and to the scan enabling path for providing the scan enabling signal triggering the scan mode of the first multiplexer.

This may have the beneficial effect that using the write enabling and scan enabling paths the switching of the first multiplexer between the read, first write, and scan mode may be controlled efficiently.

According to embodiments, the memory array further comprises a second local clock buffer electrically conductive connected to one or more clock signal inputs of the second latch for providing the second latch with a third and a fourth local clock signal, the first and the second local clock buffer are configured to be selectively operated in the scan mode for performing the test of the memory array, in the scan mode the first local clock buffer provides the first latch with the second local clock signal triggering the first latch to capture second scan data from its second data input, the second local clock buffer provides the second latch with the fourth local clock signal triggering the second latch to capture second scan data from its second data input, the second local clock buffer further is configured to be selectively operated in a first write mode for the write access or in a read mode for the read access to the memory array, in the read mode and the first write mode the second local clock buffer provides the second latch with the third local clock signal triggering the second latch to capture the second address data from its first data input.

This may have the beneficial effect that the first and second local clock buffer provide an efficient control for selectively operating the first and second latch in the scan mode allowing applying automated test procedures like e.g. LBIST. This may further have the beneficial effect that the second local clock buffer provides an efficient control for selectively switching the mode of operation of the second latch from the read mode to the first write mode and vice versa by switching the mode of operation of the second local clock buffer.

According to embodiments, the first local clock buffer is electrically conductive connected to a write enabling path for providing a write enabling signal triggering the first write mode of the first local clock buffer, the first and the second local clock buffer are electrically conductive connected to a scan enabling path for providing a scan enabling signal triggering the scan mode of the first and second local clock buffer.

This may have the beneficial effect that using the write enabling path the switching of the first local clock buffer between the read and first write may be controlled efficiently. Further, using the scan enabling path the initiating of the scan mode of the first and second local clock buffer may be controlled efficiently.

According to embodiments, the second data input of the second latch is electrically conductive connectable by a second multiplexer to the first address data path, the second multiplexer and the at least two latches are configured to be selectively operated in a second write mode for the write access to the memory array, in the second write mode the second data input of the second latch is electrically conductive connected to the first address data path by the second multiplexer, first address data is captured by the first latch from its first data input and by the second latch from its second data input.

This may have the beneficial effect that the second data input of the second latch arranged at the input of the second address decoder may be used for providing first address data to the respective address decoder via the second multiplexer arranged in front of the respective second input. The first data input of the second latch allows performing a read operation without involving the second multiplexer. By avoiding the second multiplexer in the data path for read operations the read access performance may be improved. This may further have the beneficial effect that a second write mode using the second address data of the second address data path is provided.

Thus, by selecting either the first or the second write mode, a circuitry providing address data of the cell or word to be written is enabled to select which of the two address data paths is used for providing the respective address data to the two address decoders. Depending on the origin of the respective address data one of the two address path may provide a more direct and thus more efficient path to the address decoders than the other one of the address paths. By selecting the address data path which provides a more direct path to the address decoders, the write access may be improved by providing the address data faster to the address decoders using a shorter and/or simpler path.

According to embodiments, the second local clock buffer is configured to be selectively operated in a second write mode for the write access to the memory array, in the second write mode the second local clock buffer provides the second latch with the fourth local clock signal triggering the second latch to capture the first address data from its second data input.

This may have the beneficial effect that the second local clock buffer provides an efficient control for selectively switching the mode of operation of the second latch from the read mode to the second write mode and vice versa by switching the mode of operation of the second local clock buffer.

According to embodiments, the first and second local clock buffer are electrically conductive connected to a multiplexer selecting path for providing a multiplexer selection signal for selectively triggering both local clock buffers to be operated in the first or the second write mode, the second local clock buffer is electrically conductive connected to a write enabling path for providing a write enabling signal triggering the second local clock buffer to be operated in the second write mode.

This may have the beneficial effect that using the multiplexer selection path the switching of the first and second local clock buffer between first and second write mode may be controlled efficiently, i.e. whether the first multiplexer is used to provide both latches with the first address data or whether the second multiplexer is used to provide both latches with the second address data. Further, by using the write enabling path the switching of the second local clock buffer between the read and second write mode may be controlled efficiently.

According to embodiments, the second data input of the second latch being electrically conductive connectable to the second scan data path by the second multiplexer, in the scan mode the second data input of the second latch is electrically conductive connected to the second scan data path by the second multiplexer.

This may have the beneficial effect that the scan functionality is efficiently implemented in the present setup also for the second latch, even though the second data input of the second latch, like the one of the first latch, originally reserved for the scan functionality is additionally used for the second write mode.

According to embodiments, the first and second multiplexer is electrically conductive connected to the multiplexer selecting path for providing the multiplexer selection signal for selectively triggering both multiplexer to be operated in the first or the second write mode, the second multiplexer is electrically conductive connected to the write enabling path for providing the write enabling signal triggering the second multiplexer to be operated on the second write mode and to a scan enabling path for providing the scan enabling signal triggering the second multiplexer to be operated in the scan mode.

This may have the beneficial effect that using the multiplexer selection path the switching of the first and second multiplexer between first and second write mode may be controlled efficiently. This may further have the beneficial effect that using the write enabling and scan enabling paths the switching of the second multiplexer between the read, second write, and scan mode may be controlled efficiently.

According to embodiments, the first multiplexer is electrically conductive connected to the write enabling path, the method further comprises: providing the write enabling signal triggering the first write mode of the first multiplexer.

This may have the beneficial effect that using the write enabling signal the switching of the first multiplexer between the read and first write mode may be controlled efficiently.

According to embodiments, the memory array further comprises a first local clock buffer being electrically conductive connected to one or more clock signal inputs of the first latch for providing the first latch with a first and a second local clock signal, the method further comprises: for the write access to the memory array operating the first local clock buffer in a first write mode by triggering the first local clock buffer to provide the first latch with the second local clock signal triggering the first latch to capture the second address data from its second data input; for the read access to the memory array operating the first local clock buffer in a read mode by triggering the first local clock buffer to provide the first latch with the first local clock signal triggering the first latch to capture the first address data from its first data input.

This may have the beneficial effect that using the first and second local clock signals provides an efficient method of controlling the switching of the mode of operation of the first latch from the read mode to the first write mode and vice versa.

According to embodiments, the first local clock buffer is electrically conductive connected to a write enabling path, the method further comprises: providing a write enabling signal triggering the first local clock buffer to be operated in the first write mode.

This may have the beneficial effect that using the write enabling signal the switching of the first local clock buffer between the read and first write mode may be controlled efficiently.

According to embodiments, the second data input of the first latch is electrically conductive connectable by the first multiplexer to a first scan data path for providing first scan data to initialize the first latch for performing a test of the memory array, the second latch further comprises a second data input and being configured to selectively capture data from the first or the second data input, the method further comprises: for performing the test of the memory array operating the first multiplexer and the at least two latches in a scan mode by:

electrically conductive connecting the second data input of the first latch to the first scan data path by the first multiplexer, electrically conductive connecting the second data input of the second latch to a second scan data path for providing second scan data to initialize the second latch for performing the test of the memory array, capturing first scan data by the first latch from its second data input, and capturing second scan data by the second latch from its second data input.

This may have the beneficial effect that a scan operation may be efficiently performed by initializing the values stored in the latches for testing purposes of the circuitry comprising the respective latches and/or being functionally coupled to the same. For example a logic built-in self-test (LBIST) may thus be performed efficiently.

According to embodiments, the first multiplexer is electrically conductive connected to the scan enabling path, the method further comprises: providing the scan enabling signal triggering the first multiplexer to be operated in the scan mode.

This may have the beneficial effect that using the scan enabling signal the initiating of the scan mode of the first multiplexer may be controlled efficiently.

According to embodiments, the memory array further comprises a second local clock buffer being electrically conductive connected to one or more clock signal inputs of the second latch for providing the second latch with a third local clock signal and a fourth clock signal, the method further comprises: for the test of the memory array operating the first and the second local clock buffer in the scan mode by:

providing the first latch with the second local clock signal triggering the first latch to capture first scan data from its second data input, providing the second latch with the fourth local clock signal triggering the second latch to capture second scan data from its second data input; and for the write access and for the read access to the memory array operating the second local clock buffer in the read mode and the first write mode, respectively, by providing the second latch with the third local clock signal triggering the second latch to capture the second address data from its first data input.

This may have the beneficial effect that using the local clock signals of the first and second local clock buffer the operating of the first and second latch in the scan mode may be controlled efficiently allowing applying automated test procedures like e.g. LBIST. Further, using the third and fourth local clock signal the switching of the mode of operation of the second latch between read mode and first write mode may be controlled efficiently.

According to embodiments, the first and second local clock buffer are electrically conductive connected to a scan enabling path, the method further comprises: providing a scan enabling signal triggering the first and second local clock buffer to be operated in the scan mode.

This may have the beneficial effect that using the scan enabling signal the initiating of the scan mode of the first and second local clock buffer may be controlled efficiently.

According to embodiments, the second data input of the second latch is electrically conductive connectable by a second multiplexer to the first address data path, for the write access to the memory array the method further comprises: operating the second multiplexer and the at least two latches in a second write mode by:

electrically conductive connecting the second data input of the second latch to the first address data path by the second multiplexer, and capturing first address data by the first latch from its first data input and by the second latch from its second data input.

This may have the beneficial effect that a second write mode using the second address data of the second address data path is provided. This may further have the beneficial effect that the input circuitry may be operated symmetrically in the first and second write mode with a multiplexer for each latch allowing the circuitry providing the address data to select via which address data path the respective address data for a write access is provided. For example, the shorter one of the address data paths from the origin of the address data to the address decoders may be selected.

According to embodiments, for the write access the method further comprises: operating the second local clock buffer in a second write mode by providing the fourth local clock signal triggering the second latch to capture the first address data from its second data input.

This may have the beneficial effect that operating the second local clock buffer in the second write mode the fourth local signal may be used to efficiently control the second write mode of the second latch.

According to embodiments, the first and second local clock buffer are electrically conductive connected to a multiplexer selecting path, the method further comprises: providing a multiplexer selection signal selectively triggering both local clock buffers to be operated in the first or the second write mode.

This may have the beneficial effect that using the multiplexer selection signal the switching of the first and second local clock buffer between first and second write mode may be controlled efficiently.

According to embodiments, the second local clock buffer is electrically conductive connected to a write enabling path, the method further comprises: providing a write enabling signal triggering the second local clock buffer to be operated in the second write mode.

This may have the beneficial effect that by using the write enabling signal the switching of the second local clock buffer between the read and second write mode may be controlled efficiently.

According to embodiments, the second data input of the second latch is electrically conductive connectable to the second scan data path by the second multiplexer, operating the second multiplexer in the scan mode further comprises: electrically conductive connecting the second data input of the second latch to the second scan data path by the second multiplexer.

This may have the beneficial effect that by using the second multiplexer to connect the second data input of the second latch to the second scan data path the second scan signal may be efficiently provided to the second latch.

According to embodiments, the first and second multiplexer are electrically conductive connected to the multiplexer selecting path, the method further comprises: providing a multiplexer selection signal selectively triggering both multiplexer to be operated in the first or the second write mode.

This may have the beneficial effect that using the multiplexer selection signal the switching of the first and second multiplexer between first and second write mode may be controlled efficiently.

According to embodiments, the second multiplexer is electrically conductive connected to the write enabling path, the method further comprises: providing the write enabling signal triggering the second multiplexer to be operated in the second write mode.

This may have the beneficial effect that using the write enabling signal the switching of the second multiplexer between the read and second write mode may be controlled efficiently.

According to embodiments, the second multiplexer is electrically conductive connected to a scan enabling path, the method further comprises: providing the scan enabling signal triggering the second multiplexer to be operated in the scan mode.

This may have the beneficial effect that using the scan enabling signal the initiating of the scan mode of the second multiplexer may be controlled efficiently.

FIG. 1 shows a schematic diagram illustrating an exemplary SRAM array 100 according to some embodiments of the invention. The SRAM array 100 comprises a plurality of 6T SRAM cells like 114 and 116 arranged in a matrix pattern with rows and columns. The second cell 114 in the first row may for illustrative reasons be considered as a first exemplary cell, while the first cell 116 in a second row of the SRAM array 100 may be considered as a second exemplary cell. All cells of the same row are each electrically conductive connected to the same pair of wordlines, i.e. wordline true (wlt) and wordline complement (wlc). The cells of the first row like e.g. cell 114 are each connected to wordlines wlt_0 110 and wlc_0 112. All cells of the same column are each electrically conductive connected to the same pair of bitlines, i.e. bitline true (blt) and bitline complement (blc). The cells of the first column like e.g. cell 116 are each connected to bitlines blc_0 118 and blt_0 120.

The SRAM array 100 may comprise two independent address decoders, i.e. an address decoder t 102 for selecting one of the wordlines true wlt_0, wlt_1, wlt_2, etc., and an address decoder c 106 for selecting one of the wordlines complement wlc_0, wlc_1, wlc_2, etc. A wordline true is addressed by the address decoder t 102 according to address data addrZ_0 which is send to the address decoder 102 via one or more address paths 104. On each address path one bit value is send. Thus, with n address paths $2^n$ addresses of $2^n$ wordlines, each address comprising n bits, may be provided. The address decoder t 102 decodes the address addr_0 received via the address path(s) and selects, i.e. asserts, a wordline true according to the decoded address. The second address decoder c 106 is configured analogously to addressing the wordlines complement by receiving an address addr_1 via the address paths 108. Using two independent address decoders 102 and 106 allows addressing a wordline true and a wordline complement independently from each other.

With the bitline conditioning circuitry 126 the bitlines true and/or complement may be pre-charged for read and write processes. With the column circuitry 128, data to be written to the cells of the array 100 may be provided to the bitlines true and/or complement connected to the respective cells and data read from the cells of the array 100 may be received from the bitlines true and/or complement connected to the respective cells. Data to be written to cells of the array 100 and data read from cells of the array 100 may be transferred to the and from the column circuitry 128 via a plurality of data paths 130, respectively.

The SRAM array 100 comprising a pair or wordlines for each row of cells and a pair of bitlines for each column of cells may be configured as a two read/one write (2R/1W) SRAM array, i.e. for a read access a wordline true and a wordline complement of different rows may be addressed by the address decoders 102 and 106, while for a write access wordline true and wordline complement of the same row may be addressed. There may be n columns, i.e. each word represented by a row of the array 100 may comprise n bits. A word of data refers to a fixed-sized piece of data handled as a unit by an instruction set or hardware of a processor. Modern processors, including embedded systems, may in general have a word size of 8, 16, 24, 32, or 64 bits, while modern general purpose computers may use 32 or 64 bits. Special purpose digital processors may use other sizes. For writing an n-bit word to one of the rows, via n data paths 130 and the column circuitry a bit of data may be provided to each pair of bitlines blt_i and blc_i with i=0, 1, 2 . . . , which are conditioned for receiving data by the bitline conditioning circuitry 126. By addressing a pair of wordlines of the same row with the address decoders 102 and 106, a data bit may be written to each cell of the respective row. For reading two n-bit words from two rows of the memory array 100, a wordline true of a first one of the respective two rows and a wordline complement of the second one of the respective two rows may be addressed. Thus, the first n-bit word of the first row which is addressed via the respective wordline true is read by the column circuitry via the n bitlines true of the array 100 and the second n-bit word of the second row which is addressed via the respective wordline complement is read via the n bitlines complement.

Figure 2:
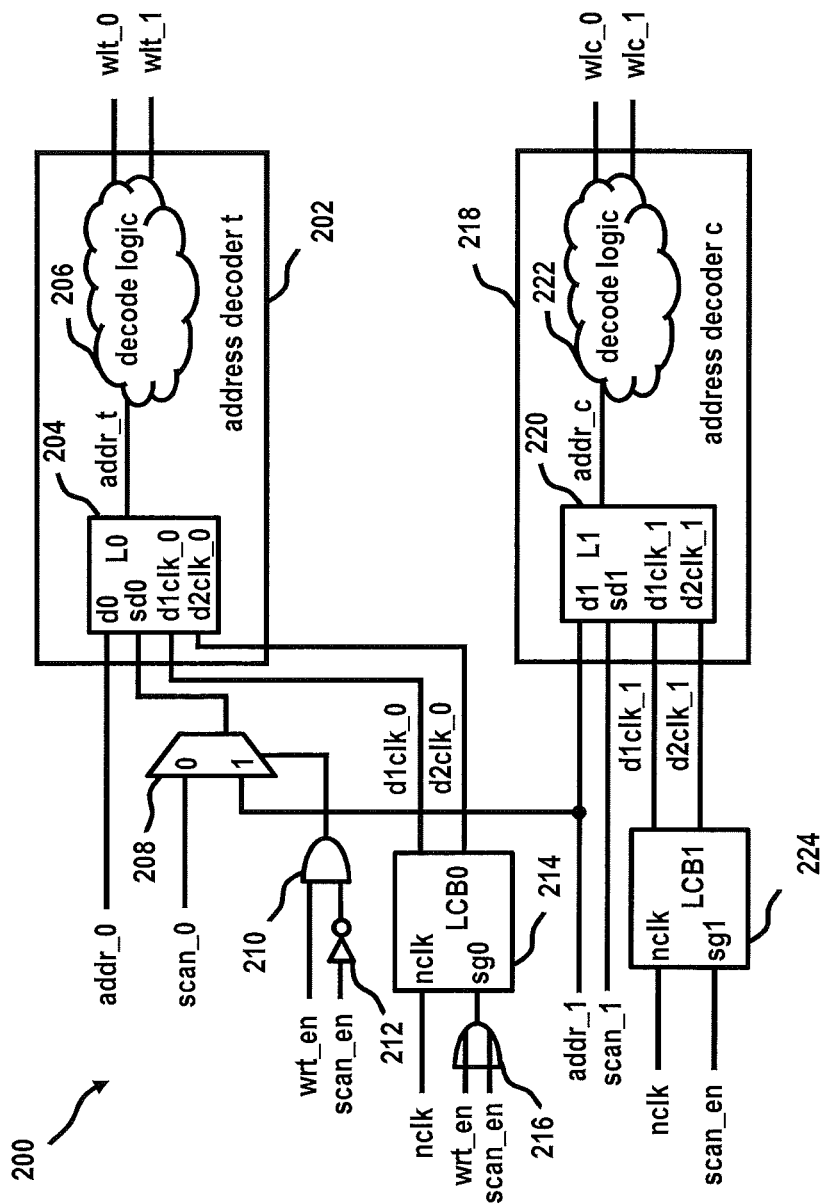
FIG. 2 depicts a schematic diagram illustrating a first exemplary input circuitry for write address synchronization in accordance with some embodiments of this disclosure.

FIG. 2 shows a schematic diagram illustrating a first exemplary input circuitry 200 for write address synchronization according to some embodiments of the invention. The input circuitry 200 comprises a first address decoder t 202 and a second address decoder c 218 for decoding addresses of wordlines wlt_0, wlt_1, wlc_0, wlt_1 provided via address paths addr_0, addr_1. Each address path connected with the second address decoder c 218 may be connectable with the first address decoder t 202 via a multiplexer 208. In FIG. 2 an exemplary address path addr_1 is shown which is electrically conductive connected with a latch L1 220 at the input of the second address decoder 218. The address path addr_1 may be one of a set of address paths each connected with a latch at the input of the address decoder 218. For $2^n$ words provided by $2^n$ rows of an SRAM array, n address paths may be provided, each address path providing one bit of the address of one of the $2^n$ words. For n address paths n latches may be provided. The decode logic 222 decodes the address addr_c provided by the address paths via latch 220 to the first address decoder 218 and selects the wordline complement, e.g. wlc_1, addressed by the decoded address. In case of a plurality of address paths connected with the second address decoder 218, each address path may also be connectable by one of a corresponding set of multiplexer with the first decoder 202.

A data input d1 of the latch 220 at the input of the address decoder 218 is connected with the address path addr_1 for providing a data bit of an address of a wordline of the SRAM array to the respective latch. The latch 220 serves as a buffer for the data bit received via the address path addr_1. The latch 220 further comprises a second data input sd1 which is connected with a scan path scan_1. The scan path scan_1 is used for initializing the latch 220 with a predefined logical value, when the circuitry comprising the latch 220 is to be tested. In order to be able to perform a well-defined testing procedure, each latch of a circuitry to be tested may be initialized with a pre-defined value. Starting with such a pre-defined state, the results may be interpreted and meaningful conclusions may be drawn.

The latch L0 204 at the input of the address decoder 202 may also have two data inputs d0 and sd0. The decode logic 206 decodes the address addr_t provided by the address paths via latch 204 to the first address decoder 202 and selects the wordline true, e.g. wlt_0, addressed by the decoded address. The first data input d0 of latch 204 is connected with the address path addr_0. The respective second data input sd0 may be configured to receive a data value via scan path scan_0 for initializing the latch 204 for test purposes. The second data input sd0 of latch 204 may be connectable with scan path scan_0 via the multiplexer 208. Via the multiplexer 208, the respective scan input sd0 may also be connectable with the exemplary address path addr_1 of the second address decoder 218. The multiplexer 208 is controlled by a write enabling path wrt_en and a scan enabling path scan_en. In the example shown in FIG. 2, the paths wrt_en and scan_en are connected with the multiplexer 208 via an AND gate 210. The path scan_en is connected with the AND gate 210 via an inverter 212. The multiplexer 208 may be configured to be switched between two modes of operation. It may selectively be operated in a write mode in which a connection between the address path addr_1 of the second address decoder 218 and the second data input sd0 of the latch 204 of the first decoder 202 is established. The second mode of operation is a read/scan mode in which the connection between the address path addr_1 of the second address decoder 218 and the second data input sd0 of the latch 204 of the first decoder 202 is interrupted. In the read/scan mode, the multiplexer 208 rather provides a connection between the scan path scan_0 and the second data input sd0 of the latch 204 of the first decoder 202. The mode of operation of multiplexer 208 depends on the control value provided via the AND gate 210. In the example shown, the multiplexer 208 is operated in the write mode, if a logical '1' is provided, and in the read/scan mode, if a logical '0' is provided. The dependency of the mode of operation of the multiplexer 208 on the signals provided via wrt_en and scan_en may be summarized by the following table:

| signal | AND gate input | AND gate output |
|---|---|---|
| wrt_en | 0 | 0 |
| scan_en | 0 | |
| wrt_en | 1 | 1 |
| scan_en | 0 | |
| wrt_en | 0 | 0 |
| scan_en | 1 | |
| wrt_en | 1 | 0 |
| scan_en | 1 | |

Only in the case where a write access is enabled by wrt_en=1 and scanning is disabled by scan_en=0, the multiplexer 208 is in the write mode. Otherwise, i.e. in the case scan_en=1 or both values being 0, the multiplexer 208 is operated in the read/scan mode.

When the multiplexer 208 is operated in the read/scan mode, each address decoder 202, 218 is provided with an independent address bit value via address path addr_0 and address path addr_1, respectively. Thus, both decoders 202, 218 may address wordlines of different rows, i.e. two different words may be read. When the multiplexer 208 is operated in the write mode, both address decoders 202, 218 are provided with the same address bit value by address path addr_1. In case the address is provided by a set of address paths, e.g. n address paths for an n-bit address, both decoders 202, 218 may comprise n latches for buffering the bit values of the address provided by the n address paths connected with each decoder 202, 218. Furthermore, each address path connected with the second address decoder 218 may be connectable with a corresponding latch of the first decoder 202 via a multiplexer. In the write mode, all multiplexer may be operated such that they connect the set of second address paths to the first decoder 202, such that both decoders 202, 218 are provided with identical address data bits.

Additionally, a first local clock buffer, LCB0 214, and a second local clock buffer, LCB1 224, may be provided for buffering a global clock signal nclk provided via clock path nclk. Each local clock buffer 214, 224 may also be controlled by the scan enabling path scan_en with the first local clock LCB0 214 additionally controlled by the write enabling path wrt_en. These paths may be connected with LCB0 214 via an OR gate 216 and provide a scan gate of the LCB0 214 with a signal sg0. The path scan_en may be connected with LCB1 224 directly, providing a scan gate of the LCB1 224 with a signal sg1. Depending on the values of sg0 and sg1, the latches 204 and 220 are either each provided with a first local clock signal d1clk_0 and a third local clock signal d1clk_1, respectively, or with a second local clock signal d2clk_0 and a fourth local clock signal d2clk_1. The first local clock signal d1clk_0 and the third local clock signal d1clk_1 may induce the latches 204 and 220 to buffer the values provided at their first data inputs d0 and d1, respectively, while the second local clock signal d2clk_0 and the fourth local clock signal d2clk_1 may induce the latches 204 and 220 to buffer the values provided at their second data inputs sd0 and sd1, respectively. For example, for sg0=0 and sg1=0 the first local clock signal d1clk_0 and the third local clock signal d1clk_1 may be provided to the latches 204 and 220, respectively, whereas for sg0=1 and sg1=1 the second local clock signal d2clk_0 and the fourth local clock signal d2clk_1 may be provided. The dependency of sg0 on wrt_en and scan_en may be summarized by the following table, cf. also FIG. 6:

| signal | OR gate input | OR gate output |
|---|---|---|
| wrt_en | 0 | 0 |
| scan_en | 0 | |
| wrt_en | 1 | 1 |
| scan_en | 0 | |
| wrt_en | 0 | 1 |
| scan_en | 1 | |
| wrt_en | 1 | 1 |
| scan_en | 1 | |

When scanning is enabled, scan_en=1, i.e. scan values for initialization are to be provided to both latches 204, 220, the second and fourth local clock signal d2clk_0, d2clk_1 are sent. The second local clock signal d2clk_0 may also be sent for the write mode, i.e. wrt_en=1 and scan_en=0, when the second address path addr_1 is connected to the first latch 204 via the multiplexer 208, such that the same address data provided by addr_1 is sent to both latches 204, 220 of both decoders 202, 208.

For performing a scan operation with input circuitry 200, the bit values provided via paths wrt_en and scan_en may thus be controlled such that multiplexer 208 is provided with a logical bit value of '0' and the local clock buffers 214, 224 with sg0=1 and sg1=1, respectively. In this case, multiplexer 208 and local clock buffers 214, 224 are operated in a scan mode. Therefore, multiplexer 208 establishes a connection between the first scan path scan_0 and the second data input sd0 of latch 204. Local clock buffers 214, 224 provide the latches 204, 220 with second and fourth local clock signal d2clk_0, d2clk_1 controlling the latches 204, 220 to be operated in the scan mode as well and capturing scan data provided by the scan paths scan_0, scan_1 via their second data inputs sd0, sd1.

For performing a read operation with input circuitry 200, the bit values provided via paths wrt_en and scan_en may be controlled such that multiplexer 208 is provided with a logical bit value of '0' and the local clock buffers 214, 224 with sg0=0 and sg1=0, respectively. In this case, multiplexer 208 and local clock buffers 214, 224 are operated in a read mode. Like before, the multiplexer 208 may establish a connection between the first scan path scan_0 and the second data input sd0 of latch 204. However, during read operations no data values provided via the multiplexer 208 are captured by latch 204. Local clock buffers 214, 224 provide the latches 204, 220 with first and third local clock signal d1clk_0, d1clk_1 controlling the latches 204, 220 to be operated in the read mode and capturing address data provided by the address data paths addr_0, addr_1 via their first data inputs d0, d1.

For performing a write operation with input circuitry 200, the bit values provided via paths wrt_en and scan_en may be controlled such that multiplexer 208 is provided with a logical bit value of '1' and the local clock buffers 214, 224 with sg0=1 and sg1=0, respectively. In this case, multiplexer 208 and local clock buffers 214, 224 are operated in a write mode. Multiplexer 208 establishes a connection between the second address data path addr_1 and the second data input sd0 of latch 204. Local clock buffer 214 provides latch 204 with second local clock signal d2clk_0 controlling the latch 204 to be operated in the write mode and capturing from its second data input sd0 second address data provided by the second address data path addr_1 via the multiplexer 208. Local clock buffer 224 provides latch 220 with third local clock signal d1clk_1 controlling the latch 220 to be operated in the write mode and capturing from its first data input d1 second address data provided by the second address data path addr_1.

Figure 3:
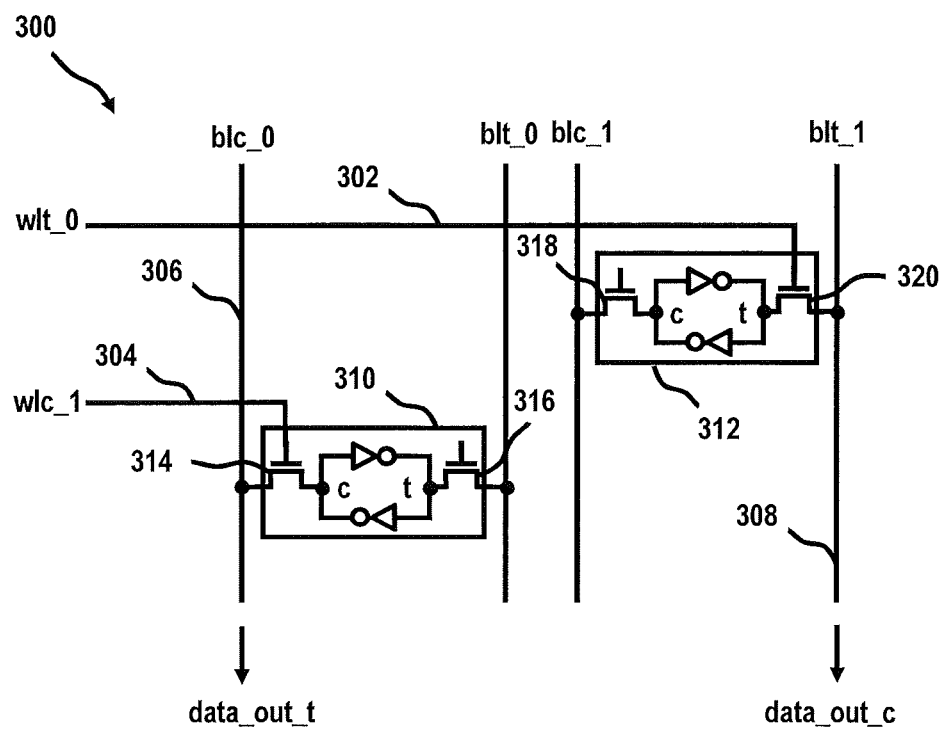
FIG. 3 depicts a schematic diagram illustrating an exemplary read access to two SRAM cells of the exemplary SRAM array of FIG. 1 in accordance with some embodiments of this disclosure.

FIG. 3 shows a schematic diagram illustrating an exemplary read access to two SRAM cells 310, 312 of the exemplary SRAM array 100 of FIG. 1 according to some embodiments of the invention. Both cells 310, 312 are 6T SRAM cells comprising four transistors forming a storage element in form of two cross-coupled inverters and two access transistors which serve to control access to the cell during read and/or write operations. A first transistor 316, 320 of each pair of access transistors is connected to a wordline true wlt and a bitline true blt, while the second transistor 314, 318, is connected to a wordline complement wlc and a bitline complement blc. By selecting a wlt, each access transistor 316, 320 of each cell connected with the respective wlt is establishing the connection to the blt of the respective cell. The same holds true for the selecting a wlc, i.e. each access transistor 314, 318 of each cell connected with the respective wlc is establishing the connection to the blc of the respective cell. In FIG. 3, the wordline true wlt_0 302 and the wordline complement wlc_1 304 of different pairs of wordlines are asserted synchronously. Therefore, access transistor 320 of cell 312 opens such that the data bit stored in cell 312 is read via the blt_1 308 as a data output data_out_c. In parallel, the access transistor 314 of cell 310 opens such that the data bit stored in cell 310 is read via the blc_0 306 as a data output data_out_t.

Figure 4:
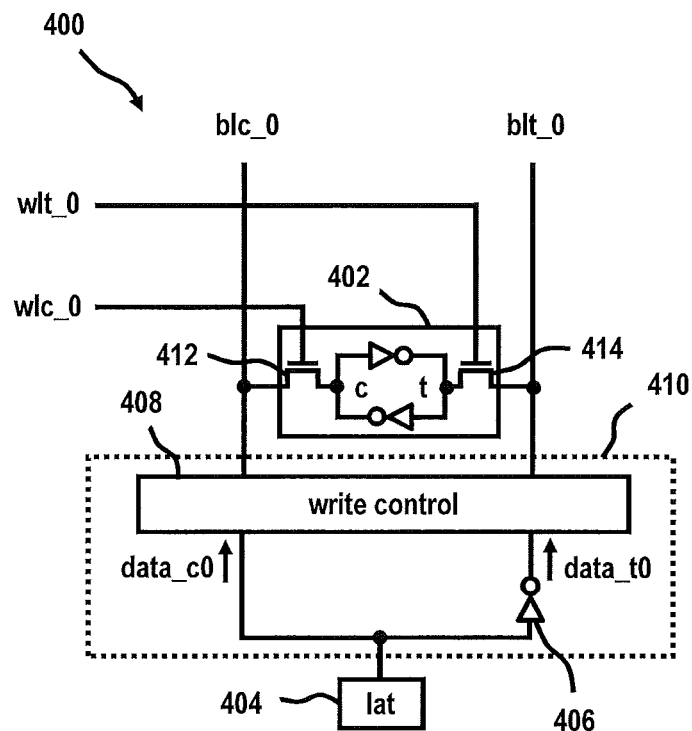
FIG. 4 depicts a schematic diagram illustrating an exemplary write access to an SRAM cell of the exemplary SRAM array of FIG. 1 in accordance with some embodiments of this disclosure.

FIG. 4 shows a schematic diagram illustrating an exemplary write access to an SRAM cell 402 of the exemplary SRAM array 100 of FIG. 1 according to some embodiments of the invention. According to the example of FIG. 4 the wordline true wlt_0 and the wordline complement wlc_0 of the same pair of wordlines, i.e. of the same row, are addressed. In this case, both access transistors of an exemplary 6T SRAM cell 402 of the respective row open such that a new data bit may be written to the cell 402 via the bitline true blt_0 and the bitline complement blc_0 connected to the cell 402. The data bit to be written to the cell 402 may be provided from a data latch lat 404 via the column circuitry 410 to both blt_0 and blc_0. The write access, i.e. the data connection between the data latch 404 and the bitlines may be controlled by a write control 408 comprised by the column circuitry. The write control 408 establishes the respective connection in case of a write access and interrupts the respective connection otherwise. The data data_c0 provided via the blc_0 and the data data_t0 provided via the blt_0 are inverted due to the inverter 406.

Figure 5:
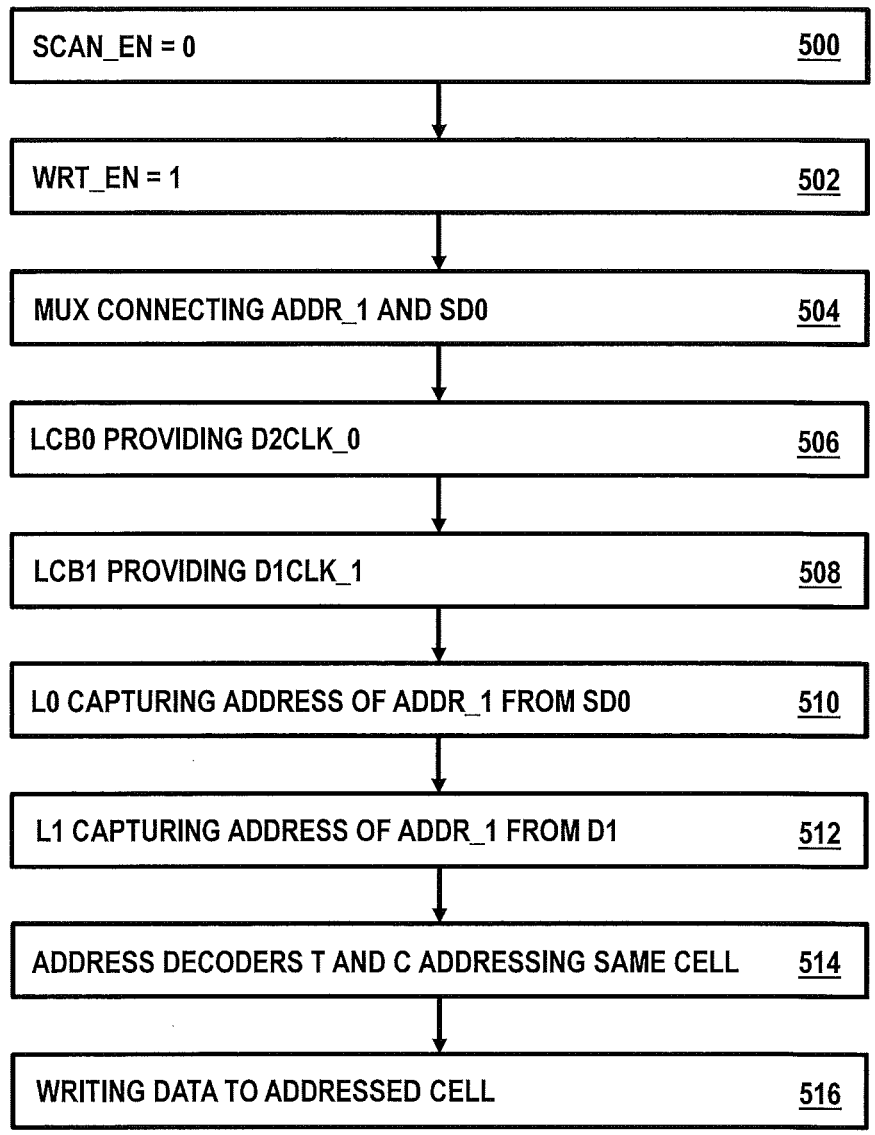
FIG. 5 depicts a first schematic block diagram of an exemplary method for write access synchronization using the exemplary circuitry of FIG. 2 in accordance with some embodiments of this disclosure.

FIG. 5 shows a first schematic block diagram of an exemplary method for write access synchronization using the exemplary circuitry 200 of FIG. 2 operated in the write mode according to some embodiments of the invention. In block 500, a scan enabling signal scan_en=0 is provided on the respective scan enabling path. In block 502, a write enabling signal wrt_en=1 is provided on the respective write enabling path. In block 504, the multiplexer 208, herein also referred to as mux, is controlled by the scan enabling signal scan_en=0 and the write enabling signal wrt_en=1 to connect the second data input sd0 of the first latch 204 with the second address data path addr_1. In block 506, the first local clock buffer 214 is controlled by the scan enabling signal scan_en=0 and the write enabling signal wrt_en=1 to provide the second local clock signal d2clk_0 to the first latch 204. In block 508, the second local clock buffer 224 is controlled by the scan enabling signal scan_en=0 to provide the third local clock signal d1clk_1 to the second latch 220. In block 510, the first latch 204 is controlled by the second local clock signal d2clk_0 to capture from its second data input sd0 second address data provided by the second address data path addr_1 via the multiplexer 208. In block 512, the second latch 220 is controlled by the third local clock signal d1clk_1 to capture from its first data input d1 second address data provided by the second address data path addr_1. In block 514, both address decoders 202, 218 thus decode identical address data using the address bit values buffered by the latches 204, 220 to address the same 6T SRAM cell. In block 516, data is written on the 6T SRAM cell addressed by both address decoders via the pair of bitlines, i.e. bitline true and bitline complement, connected to the respective cell via its first and second access transistors. The respective access transistors are controlled to be open simultaneously by the first and second address decoders 202, 218 via the pair of wordline, i.e. wordline true and wordline complement, connected with the respective access transistors. Blocks 500 to 504 may be performed synchronously.

Figure 6:
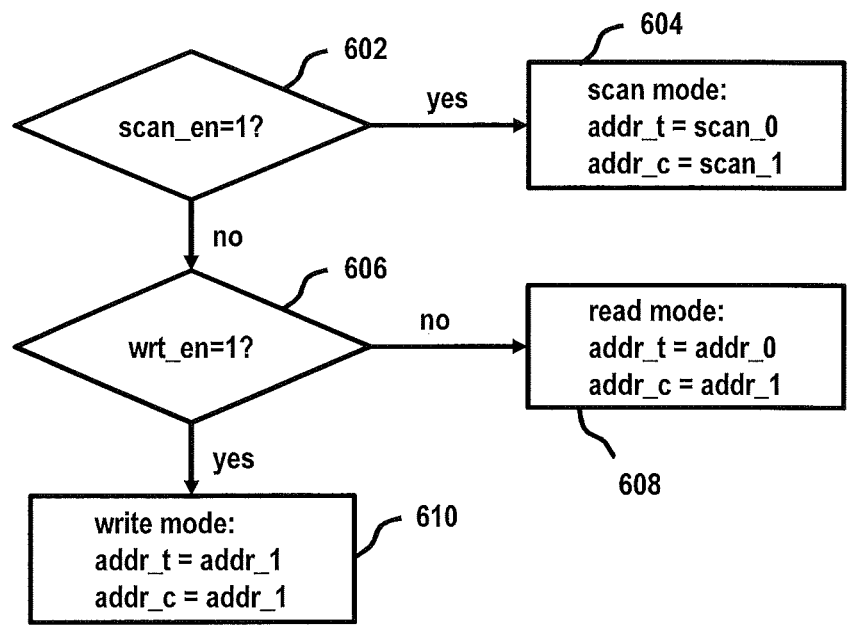
FIG. 6 depicts a second schematic block diagram of the exemplary method for write access synchronization using the exemplary circuitry of FIG. 2 in accordance with some embodiments of this disclosure.

FIG. 6 shows a second schematic block diagram of the exemplary method for write access synchronization using the exemplary circuitry 200 of FIG. 2 according to some embodiments of the invention. The circuitry 200 implements a logic according to which the selection of the data values buffered by the first latch 204, i.e. addr_t, and by the second latch 220, i.e. addr_c, in order to be used by the two address decoders 202 and 218, respectively, is controlled depending on the data values of scan_en and wrt_en. In block 602, it is checked, whether the value provided by the scan enabling path scan_en is '1'. In response to scan_en=1, the circuitry 200 may be operated in the scan mode. The multiplexer 208 may be controlled to connect the second data input sd0 of the first latch 204 with the first scan path scan_0. The local clock buffers may both be operated such that the bit values of the second data inputs, i.e. the scan data inputs sd0, sd1, are buffered in the latches 204, 220. In such a scan mode according to block 604, the data value addr_t received by the first address decoder t 202 is scan_0 provided by the respective scan path and the data value addr_c received by the second address decoder c 218 is scan_1 provided by the respective scan path. Thus, the latches 204, 220 of both decoders 202, 220 are initialized with independent bit values scan_0, scan_1.

In response to scan_en=0, it is checked in block 606, whether the value provided by the write enabling path wrt_en is '1'. In response to wrt_en=0, the circuitry 200 may be operated in the read mode according to block 608 with the data value addr_t received by the first address decoder t 202 being first address data addr_0 provided by the respective address path and the data value addr_c received by the second address decoder c 218 being second address data addr_1 provided by the respective address path. Thus, both decoders 202, 218 are provided with independent word, i.e. row, addresses. In response to wrt_en=1, the circuitry 200 may be operated in the write mode according to block 610 with the data value addr_t received by the first address decoder t being second address data addr_1 provided by the respective address path via the multiplexer 208 and the scan input sd0 of the respective latch L0 of the first decoder t and the data value addr_c received by the second address decoder c being second address data addr_1 as well. Thus, both decoders 202, 218 are provided with the same word, i.e. row, addresses.

Figure 7:
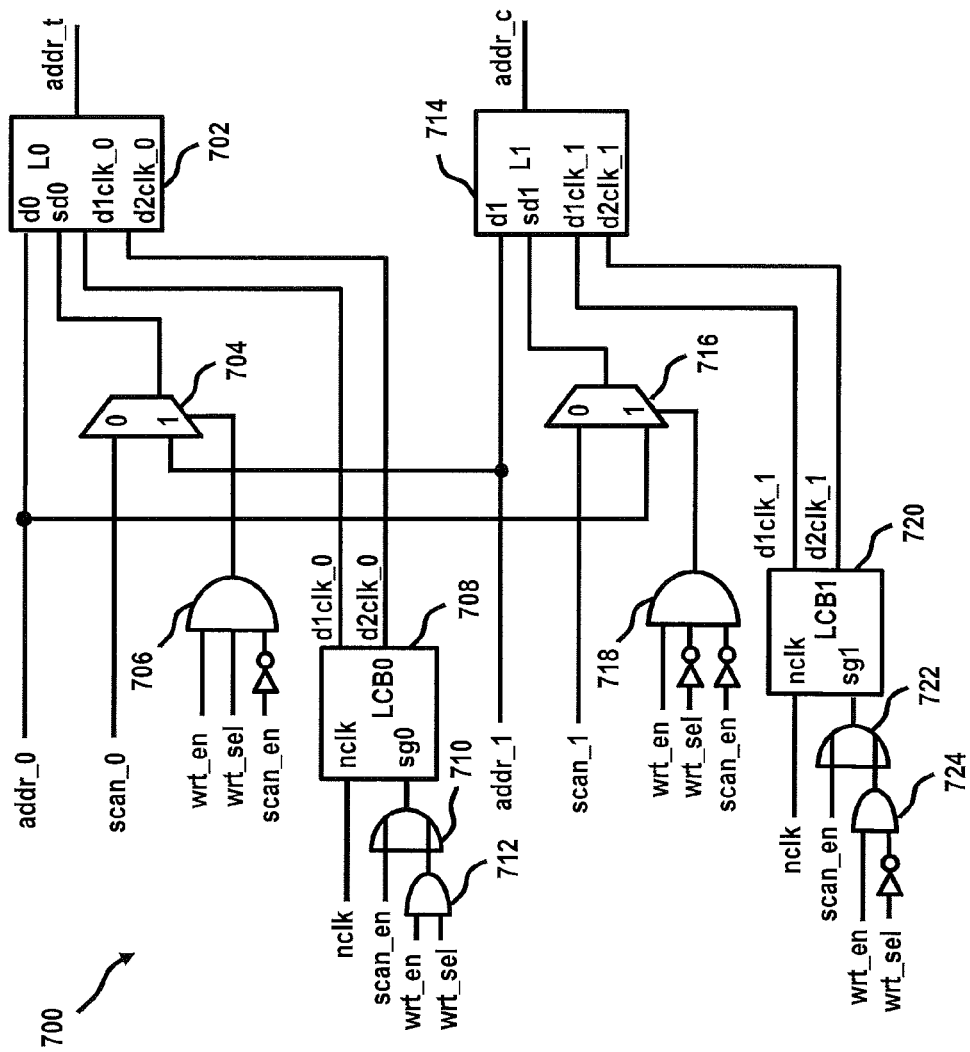
FIG. 7 depicts a schematic diagram illustrating a second exemplary input circuitry for write address synchronization in accordance with some embodiments of this disclosure.

FIG. 7 shows a schematic diagram illustrating a second exemplary input circuitry 700 for write address synchronization according to some embodiments of the invention. The input circuitry 200 shown in FIG. 2 is asymmetric, since only the address path addr_1 is connectable to a further address decoder, i.e. the first decoder 202, via multiplexer 208, while the address path addr_0 is not configured to be connectable with a further address decoder via a multiplexer in an analogous way. Considering the write access itself via the multiplexers 704, 716 and address decoders 702, 714, this asymmetry may in general be negligible. However, considering the address paths addr_0 and addr_1, one of the two may provide a shorter path from the origin of the address data to the address decoders 702, 714. By selecting the address data path addr_0, addr_1 which provides a more direct path to the address decoders 702, 714, the write access may be improved by providing the address data faster to the address decoders 702, 714 using a shorter and/or simpler path. The second exemplary input circuitry 700 implements a symmetric design.

Compared with the input circuitry 200 shown in FIG. 2, the input circuit 700 of FIG. 7 comprises in addition to a first multiplexer 704 via which the second address path addr_1 is connectable with a first latch 702 of a first address decoder t a second multiplexer 716 via which the first address path addr_0 is connectable with the second latch 714 of a second address decoder c. The first latch 702 provides the address addr_t to a decoder logic of the first decoder t. The second latch 714 provides the address addr_c to a decoder logic of the first decoder c. In order to control which one of the multiplexers 704 and 716 is selectively switched into a write mode, an additional multiplexer selecting path wrt_sel is provided. The path wrt_sel is connected together with wrt_en and scan_en via an AND gate 706, 718 with each of the two multiplexers 704, 716. With AND gate 718 wrt_sel is connected via an inverter such that multiplexer 704, 716 are provided with inverted signals. The dependencies of the output values of the two AND gates 706 and 718 may be summarized according to the following table:

| Signal | AND gate 706 input | AND gate 706 output | Signal | AND gate 718 input | AND gate 718 output |
|---|---|---|---|---|---|
| wrt_en | 0 | | | 0 | 0 | |
| wrt_sel | 0 | 0 | | 0 | 1 | 0 |
| scan_en | 0 | 1 | | 0 | 1 | |
| wrt_en | 0 | 0 | | 0 | 0 | |
| wrt_sel | 1 | 1 | 0 | 1 | 0 | 0 |
| scan_en | 0 | 1 | | 0 | 1 | |
| wrt_en | 1 | 1 | | 1 | 1 | |
| wrt_sel | 0 | 0 | 0 | 0 | 1 | 1 |
| scan_en | 0 | 1 | | 0 | 1 | |
| wrt_en | 1 | 1 | | 1 | 1 | |
| wrt_sel | 1 | 1 | 1 | 1 | 0 | 0 |
| scan en | 0 | 1 | | 0 | 1 | |
| wrt_en | 0 | 0 | | 0 | 0 | |
| wrt_sel | 0 | 0 | 0 | 0 | 1 | 0 |
| scan_en | 1 | 0 | | 1 | 0 | |
| wrt_en | 0 | 0 | | 0 | 0 | |
| wrt_sel | 1 | 1 | 0 | 1 | 0 | 0 |
| scan en | 1 | 0 | | 1 | 0 | |
| wrt_en | 1 | 1 | | 1 | 1 | |
| wrt_sel | 0 | 0 | 0 | 0 | 1 | 0 |
| scan_en | 1 | 0 | | 1 | 0 | |
| wrt_en | 1 | 1 | | 1 | 1 | |
| wrt_sel | 1 | 1 | 0 | 1 | 0 | 0 |
| scan_en | 1 | 0 | | 1 | 0 | |

Only in the two cases with a write access being enabled by wrt_en=1 and scanning being disabled by scan_en=0, one of the multiplexer 704, 716 is in a write mode. Otherwise, the multiplexers 706, 718 are operated in a read/scan mode. For wrt_sel=1 the first multiplexer 704 is in a first write mode in which both latches 702 and 714 may be provided with and buffer second address data addr_1. For wrt_sel=0 the second multiplexer 716 is in a second write mode in which both latches 702 and 714 may be provided with and buffer first address data addr_0.

Furthermore, also the two local clock buffers 708, 720 comprised by the input circuitry 700 are connected with the multiplexer selecting path wrt_sel. First local clock buffer 708 provides the first latch 702 with first and second local clock signals d1clk_0 and d2clk_0 controlling the data inputs d0 and sd0 of the respective first latch 702, while local clock buffer 720 provides the second latch 714 with third and fourth local clock signals d1clk_1 and d2clk_1 controlling the data inputs d1 and sd1 of the respective second latch 714. The local clock signals d1clk_0, d2clk_0 and d1clk_1, d2lck_1 provided by LCB0 708 and LCB1 720, respectively, depend on the value of the scan gates sg0 and sg1 of the respective LCB0 and LCB1.

The paths wrt_en and wrt_sel are connected with each local clock buffer 708, 720 via an AND gate 712, 724, respectively. The outputs of the respective AND gate 712, 724 are each connected together with the path scan_en via an OR gate 710, 722, respectively, to the local clock buffer 708, 720. The resulting dependencies of the scan gate values sg0, sg1 of LBC0 708 and LBC1 720 may be summarized according to the following table:

| Signal | OR gate 710 input | OR gate 710 output | Signal | OR gate 722 input | OR gate 722 output |
|---|---|---|---|---|---|
| wrt_en  | 0 |   |         | 0 |   |
| wrt_sel | 0 | 0 | 0       | 0 | 0 |
| scan_en | 0 | 0 |         | 0 | 0 |
| wrt_en  | 0 |   |         | 0 |   |
| wrt_sel | 1 | 0 | 0       | 1 | 0 | 0 |
| scan_en | 0 | 0 |         | 0 | 0 |
| wrt_en  | 1 |   |         | 1 |   |
| wrt_sel | 0 | 0 | 0       | 0 | 1 | 1 |
| scan_en | 0 | 0 |         | 0 | 0 |
| wrt_en  | 1 |   |         | 1 |   |
| wrt_sel | 1 | 1 | 1       | 1 | 0 | 0 |
| scan_en | 0 | 0 |         | 0 | 0 |
| wrt_en  | 0 |   |         | 0 |   |
| wrt_sel | 0 | 0 | 1       | 0 | 0 | 1 |
| scan_en | 1 | 1 |         | 1 | 1 |
| wrt_en  | 0 |   |         | 0 |   |
| wrt_sel | 1 | 0 | 1       | 1 | 0 | 1 |
| scan en | 1 | 1 |         | 1 | 1 |
| wrt_en  | 1 |   |         | 1 |   |
| wrt_sel | 0 | 0 | 1       | 0 | 1 | 1 |
| scan en | 1 | 1 |         | 1 | 1 |
| wrt_en  | 1 |   |         | 1 |   |
| wrt_sel | 1 | 1 | 1       | 1 | 0 | 1 |
| scan en | 1 | 1 |         | 1 | 1 |

For the two write modes with write access being enabled by wrt_en=1 and scanning being disabled by scan_en=0, the outputs of the two OR gates 710, 720 and thus the scan gate values sg0, sg1 of LBC0 708 and LBC1 720 are inverted with respect to each other. For all other combinations of wrt_en and scan_en the two OR gates 710, 720 are equal, i.e. both latches 702, 714 are controlled by the synchronously captured data from their first data inputs d0, d1 or their second data inputs sd0, sd1.

For wrt_sel=1 the resulting first scan gate value sg0=1 and the resulting second scan gate value sg1=0. Thus, both local clock buffers 708, 720 are operated in the first write mode in which the first latch 702 is controlled by the second local clock signal d2clk_0 to capture second address data addr_1 from its second data input sd0 and the second latch 714 is controlled by the third local clock signal d1clk_1 to also capture second address data addr_1 from its first data input d1.

For wrt_sel=0 the resulting first scan gate value sg0=0 and the resulting second scan gate value sg1=1. Thus, both local clock buffers 708, 720 are operated in the second write mode in which the first latch 702 is controlled by the first local clock signal d1clk_0 to capture first address data addr_0 from its first data input d0 and the second latch 714 is controlled by the fourth local clock signal d2clk_1 to also capture first address data addr_0 from its second data input sd1.

For performing a scan operation with input circuitry 700, the bit values provided via paths wrt_en and scan_en may thus be controlled such that both multiplexers 704, 716 are provided with a logical bit value of '0' and the local clock buffers 708, 720 with sg0=1 and sg1=1, respectively. In this case, multiplexers 704, 716 and local clock buffers 708, 720 are operated in a scan mode. Therefore, multiplexer 704 establishes a connection between the first scan path scan_0 and the second data input sd0 of first latch 702, while multiplexer 716 establishes a connection between the second scan path scan_1 and the second data input sd1 of second latch 714. Local clock buffers 708, 720 provide the latches 702, 714 with second local clock signal d2clk_0 and fourth local clock signal d2clk_1 controlling the latches 702, 714 to be operated in the scan mode as well and capturing scan data provided by the scan paths scan_0, scan_1 via their second data inputs sd0, sd1.

For performing a read operation with input circuitry 700, the bit values provided via paths wrt_en and scan_en may be controlled such that both multiplexers 704, 716 are provided with a logical bit value of '0' and the local clock buffers 708, 720 with sg0=0 and sg1=0, respectively. In this case, multiplexers 704, 716 and local clock buffers 708, 720 are operated in a read mode. Like before, the multiplexers 704, 716 may establish connections between the first scan path scan_0 and the second data input sd0 of first latch 702 as well as between the second scan path scan_1 and the second data input sd1 of second latch 714. However, during read operations no data values provided via the multiplexers 704, 716 are captured neither by latch 702 nor by latch 714. Local clock buffers 708, 720 provide the latches 702, 714 with first and third local clock signals d1clk_0, d1clk_1 controlling the latches 702, 714 to be operated in the read mode and capturing address data provided by the address data paths addr_0 and addr_1 via their first data inputs d0, d1.

For performing a first write operation with input circuitry 700, the bit values provided via paths wrt_sel, wrt_en, and scan_en may be controlled as described above such that the first latch 702 captures second address data addr_1 via the first multiplexer 704 from its second data input sd0, while the second latch 714 also captures second address data addr_1 from its first data input d1. For performing a second write operation with input circuitry 700, the bit values provided via paths wrt_sel, wrt_en, and scan_en may be controlled as described above such that the second latch 714 captures first address data addr_0 via the second multiplexer 716 from its second data input sd1, while the first latch 702 also captures first address data addr_0 from its first data input d0.

Figure 8:
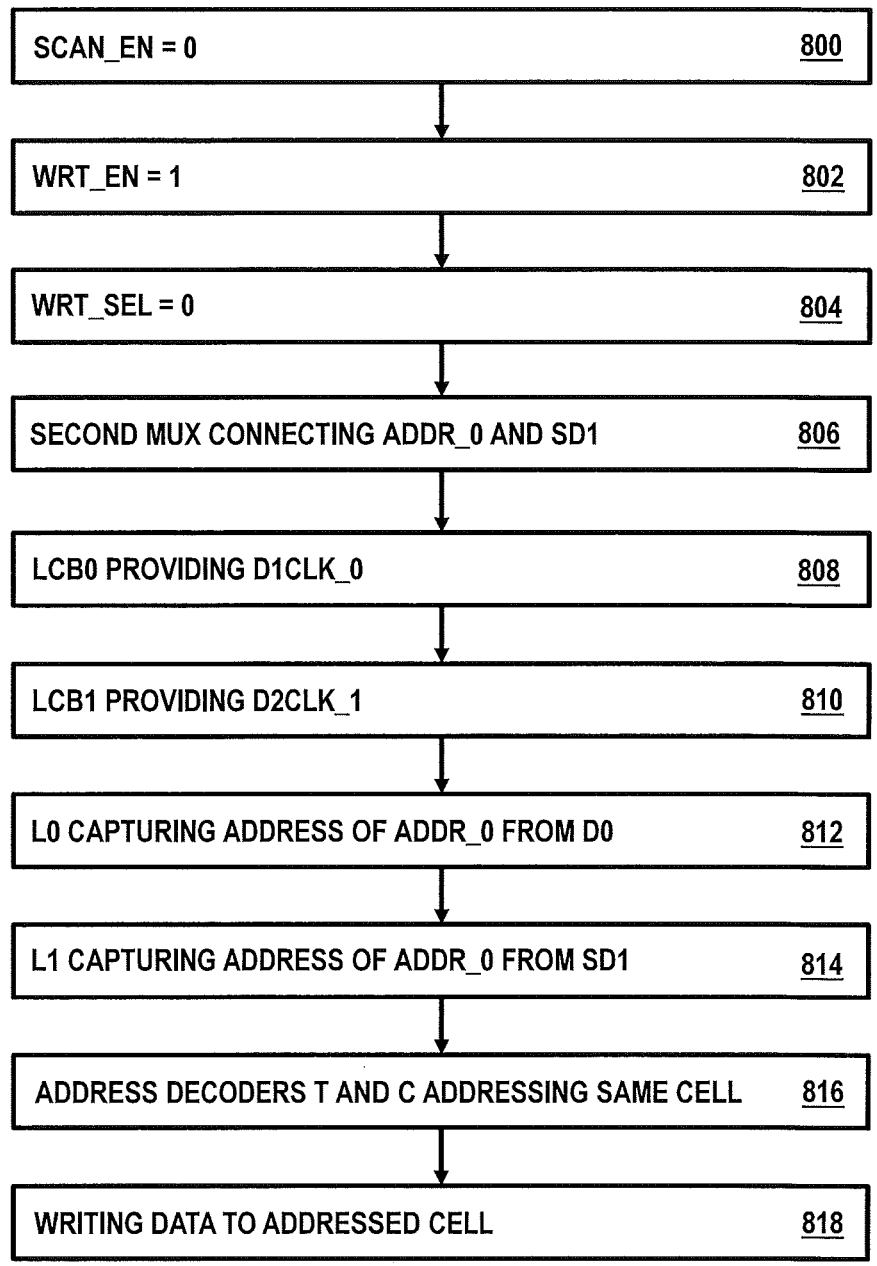
FIG. 8 depicts a first schematic block diagram of an exemplary method for write access synchronization using the exemplary circuitry of FIG. 7 in accordance with some embodiments of this disclosure.

FIG. 8 shows a first schematic block diagram of an exemplary method for write access synchronization using the exemplary circuitry 700 of FIG. 7 operated in the second write mode according to some embodiments of the invention. The blocks 800 and 802 are analog to block 500 and 502 of FIG. 5. In block 804, a multiplexer selecting signal wrt_sel=0 is provided on the respective path. In block 806, the second multiplexer 716, herein also referred to as mux, is controlled by the signals scan_en=0, wrt_en=1, and wrt_sel=0 to connect the second data input sd1 of the second latch 714 with the first address data path addr_0. In block 808, the first local clock buffer 708 is controlled by the signals scan_en=0, wrt_en=1, and wrt_sel=0 to provide the first local clock signal d1clk_0 to the first latch 702. Thus, the operational status of the first multiplexer 704 may be neglected, since no data values provided by the first multiplexer 704 are captured by first latch 702. In block 810, the second local clock buffer 720 is controlled to provide the fourth local clock signal d2clk_1 to the second latch 714. In block 812, the first latch 702 is controlled by the first local clock signal d1clk_0 to capture from its first data input d0 first address data provided by the first address data path addr_0. In block 814, the second latch 714 is controlled by the fourth local clock signal d2clk_1 to capture from its second data input sd1 first address data provided by the first address data path addr_0 via the second multiplexer 716. Blocks 816 and 818 are analogous to blocks 514 and 516 of FIG. 5. Depending on the selection of multiplexer according to block 804, also the first write mode analogous to FIG. 5 with the second address data addr_1 captured by both latches 702, 714 may be performed with circuitry 700.

Figure 9:
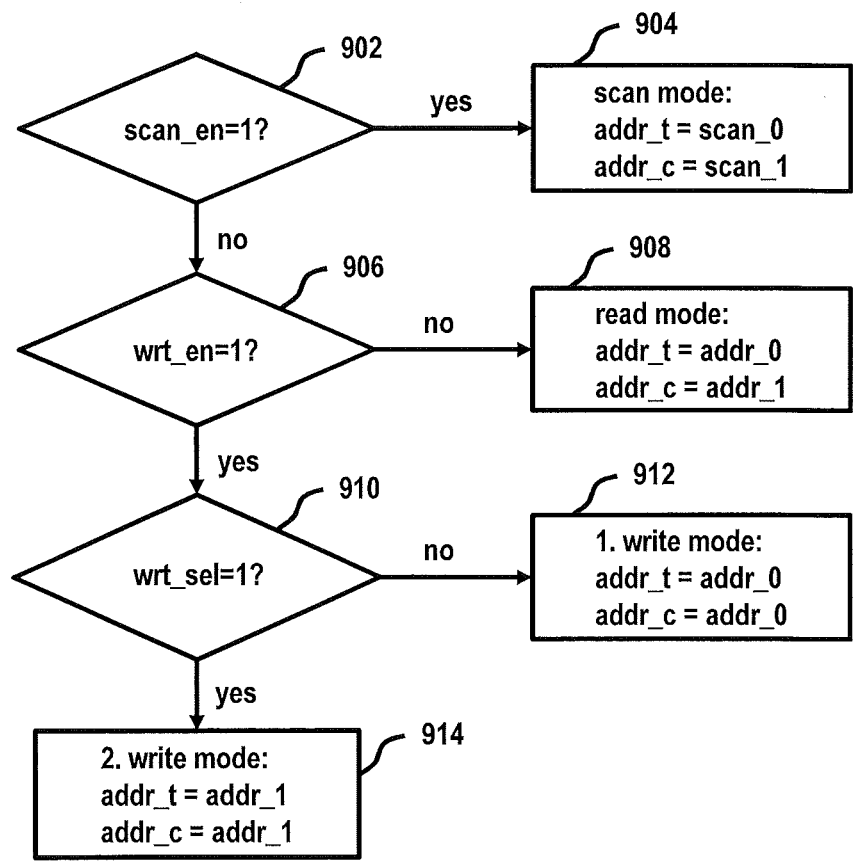
FIG. 9 depicts a second schematic block diagram of the exemplary method for write access synchronization using the exemplary circuitry of FIG. 7 in accordance with some embodiments of this disclosure.

FIG. 9 shows a second schematic block diagram of the exemplary method for write access synchronization using the exemplary circuitry 700 of FIG. 7 according to some embodiments of the invention. The circuitry 700 implements a logic according to which the selection of the data values buffered by the first latch 702, i.e. addr_t, and by the second latch 714, i.e. addr_c, in order to be used by the two address decoders each comprising one of the two latches 702, 714 is controlled depending on the data values of scan_en, wrt_en and wrt_sel. Blocks 902 to 908 correspond to blocks 602 to 608 of FIG. 6. In response to wrt_en=1 according to block 906, it may be checked in block 910, whether the value provided by the multiplexer selecting path wrt_sel being '1', i.e. whether the second address path addr_1 is selected. In response to wrt_sel=1, the address data provided to both address decoders is addr_1, i.e. addr_t=addr_1 and addr_c=addr_c using the connection between the first multiplexer 704 and the first latch 702. Else, i.e. in response to wrt_sel=0, the address data provided to both address decoders is addr_0 with addr_t=addr_0 and addr_c=addr_t using the connection between the second multiplexer 716 and the second latch 714. In any case, with wrt_en=1 and scan_en=0 both address decoders are provided with the same word, i.e. row, addresses.

Figure 10:
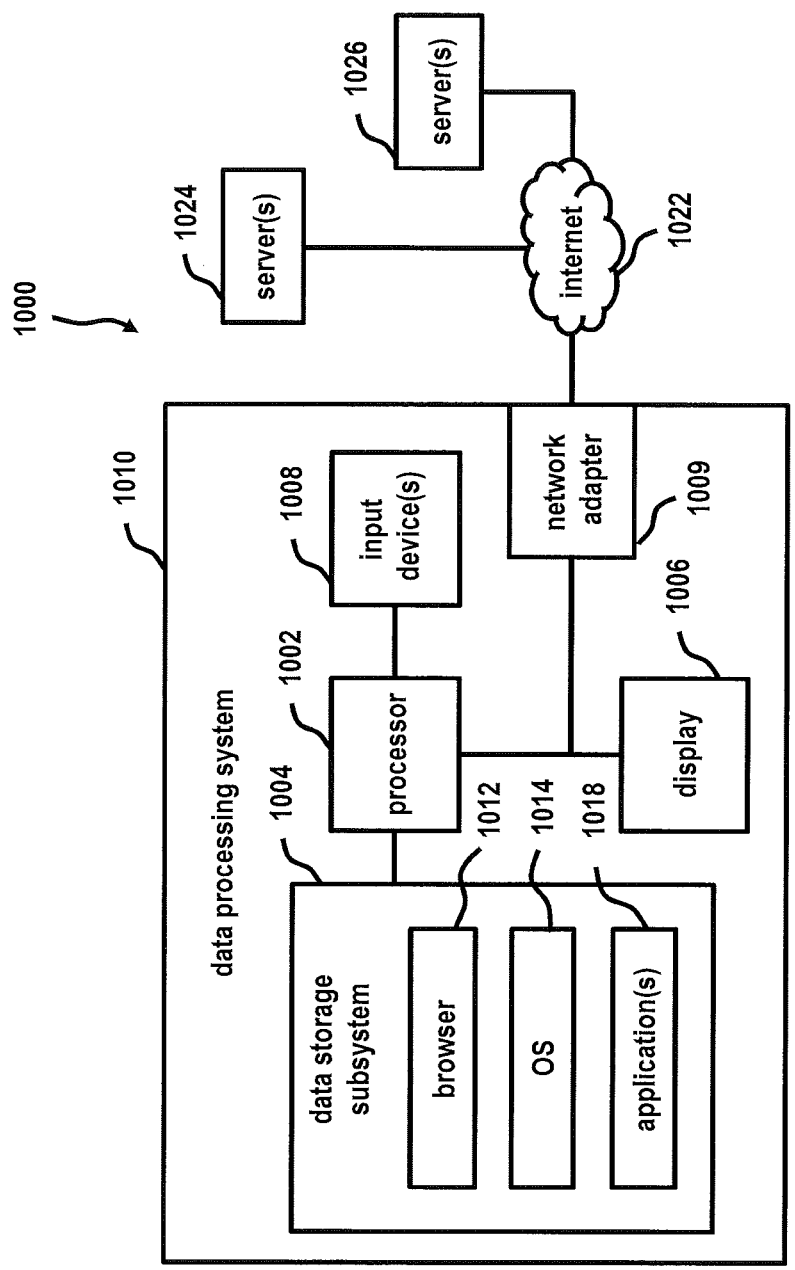
FIG. 10 depicts an exemplary data processing system environment including an exemplary data processing system with one or more SRAM arrays of FIG. 1 in accordance with some embodiments of this disclosure.

FIG. 10 shows an exemplary data processing system environment 1000 including an exemplary data processing system 1010 with one or more SRAM arrays 100 of FIG. 1 according to some embodiments of the invention. Data processing system 1010 may take various forms, such as workstations, laptop computer systems, notebook computer systems, or desktop computer systems and/or clusters thereof. Data processing system 1010 includes a processor 1002, which may include one or more processor cores for executing program code, coupled to a data storage subsystem 1004, a display 1006, one or more input devices 1008, and a network adapter 1009. Data storage subsystem 1004 may include, for example, application appropriate amounts of various memories, e.g. DRAM, SRAM, and read-only memory (ROM), and/or one or more mass storage devices, such as magnetic or optical disk drives. Processor 1002 may also include one or more cache memory levels that implement SRAM. The SRAM comprised by the data processing system 1010 may be implemented in form of SRAM arrays according to one or more embodiments of the present disclosure, e.g. comprising the exemplary circuitry 200 of FIG. 2 or the exemplary circuitry 700 of FIG. 7.

Data storage subsystem 1004 includes an operating system (OS) 1014 for data processing system 1010. Data storage subsystem 1004 also includes application programs, such as a browser 1012, which may optionally include customized plug-ins to support various client applications, and other applications 1018, like e.g. a word processing application, a presentation application, and an email application.

Display 1006 may be, for example, a cathode ray tube (CRT) or a liquid crystal display (LCD). Input device(s) 1008 of data processing system 1010 may include, for example, a mouse, a keyboard, haptic devices, and/or a touch screen. Network adapter 1009 supports communication of data processing system 1010 with one or more wired and/or wireless networks utilizing one or more communication protocols, such as 802.x, HTTP, simple mail transfer protocol (SMTP), etc. Data processing system 1010 is shown coupled via one or more wired or wireless networks, such as the Internet 1022, to various file servers 1024 and various web page servers 1026 that provide information of interest to the user of data processing system 1010.

Those of ordinary skill in the art will appreciate that the hardware components and basic configuration depicted in FIG. 10 may vary. The illustrative components within data processing system 1010 are not intended to be exhaustive, but rather are representative to highlight components that may be utilized to implement the present invention. For example, other devices/components may be used in addition to or in place of the hardware depicted. The depicted example is not meant to imply architectural or other limitations with respect to the presently described embodiments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The invention claimed is:

1. A method for operating a memory array comprising at least a first and a second six transistor static random access memory cell, and a first and a second address decoder,
   the first address decoder being electrically conductive connected to a first access transistor of each of the at least two memory cells via one or more first wordlines, the second address decoder being electrically conductive connected to a second access transistor of each of the at least two memory cells via one or more second wordlines, the first address decoder comprising at least a first latch, the second address decoder comprising at least a second latch,
   the first latch comprising a first and a second data input, the first latch being configured to selectively capture data from the first or the second data input, the respective first data input being electrically conductive connected to a first address data path for providing first address data, the respective second data input being electrically conductive connectable by a first multiplexer to a second address data path for providing second address data,
   the second latch comprising a first data input electrically conductive connected to the second address data path,
   the method comprising:
   for a write access to the memory array operating the first multiplexer and the at least two latches in a first write mode including:
      electrically conductive connecting the second data input of the first latch to the second address data path by the first multiplexer; and
      capturing second address data by the first latch from its second data input and by the second latch from its first data input; and
   for a read access to the memory array operating the first multiplexer and the at least two latches in a read mode including:
      capturing first address data by the first latch from its first data input; and
      capturing second address data by the second latch from its first data input.

2. The method of claim 1, wherein the memory array further comprises a first local clock buffer electrically conductive connected to one or more clock signal inputs of the first latch for providing the first latch with a first and a second local clock signal, and the method further comprises:
   for the write access to the memory array operating the first local clock buffer in a first write mode by triggering the first local clock buffer to provide the first latch with the second local clock signal triggering the first latch to capture the second address data from its second data input; and for the read access to the memory array operating the first local clock buffer in a read mode by triggering the first local clock buffer to provide the first latch with the first local clock signal triggering the first latch to capture the first address data from its first data input.

3. The method of claim 2, wherein the second data input of the first latch is electrically conductive connectable by the first multiplexer to a first scan data path for providing first scan data to initialize the first latch for performing a test of the memory array, the second latch further comprises a second data input and is configured to selectively capture data from the first or the second data input, and the method further comprises performing the test of the memory array operating the first multiplexer and the at least two latches in a scan mode including:
electrically conductive connecting the second data input of the first latch to the first scan data path by the first multiplexer;
electrically conductive connecting the second data input of the second latch to a second scan data path for providing second scan data to initialize the second latch for performing the test of the memory array;
capturing first scan data by the first latch from its second data input; and
capturing second scan data by the second latch from its second data input.

4. The method of claim 3, wherein the memory array further comprises a second local clock buffer electrically conductive connected to one or more clock signal inputs of the second latch for providing the second latch with a third and a fourth local clock signal, and the method further comprises:
for the test of the memory array operating the first and the second local clock buffer in the scan mode including:
providing the first latch with the second local clock signal triggering the first latch to capture first scan data from its second data input; and
providing the second latch with the fourth local clock signal triggering the second latch to capture second scan data from its second data input; and
for the write access and for the read access to the memory array operating the second local clock buffer in the read mode and the first write mode, respectively, including providing the second latch with the third local clock signal triggering the second latch to capture the second address data from its first data input.

5. The method of claim 4, wherein the second data input of the second latch is electrically conductive connectable by a second multiplexer to the first address data path, and the method further comprises for the write access to the memory array:
operating the second multiplexer and the at least two latches in a second write mode including:
electrically conductive connecting the second data input of the second latch to the first address data path by the second multiplexer; and
capturing first address data by the first latch from its first data input and by the second latch from its second data input.

6. The method of claim 5, wherein the method further comprises for the write access:
operating the second local clock buffer in a second write mode by providing the fourth local clock signal triggering the second latch to capture the first address data from its second data input.

7. The method of claim 5, wherein the first and second local clock buffer are electrically conductive connected to a multiplexer selecting path, and the method further comprises:
providing a multiplexer selection signal selectively triggering both local clock buffers to be operated in the first or the second write mode.

8. The method of claim 5, wherein the second data input of the second latch is electrically conductive connectable to the second scan data path by the second multiplexer, and
the operating the second multiplexer in the scan mode further comprises electrically conductive connecting the second data input of the second latch to the second scan data path by the second multiplexer.

* * * * *